United States Patent [19]
Itoh et al.

[11] Patent Number: 5,258,629
[45] Date of Patent: Nov. 2, 1993

[54] LIGHT-EMITTING DIODE PRINT HEAD WITH STAGGERED ELECTRODES

[75] Inventors: Masataka Itoh, Kanagawa; Masahiro Itoh, Tokyo, both of Japan

[73] Assignee: Eastman Kodak Company, Rochester, N.Y.

[21] Appl. No.: 847,514

[22] Filed: Mar. 6, 1992

[30] Foreign Application Priority Data

May 14, 1991 [JP] Japan .................................. 3-109094

[51] Int. Cl.$^5$ .................................................. H01L 33/00
[52] U.S. Cl. ........................................ 257/88; 257/91; 257/99; 257/90; 313/500; 346/107 R; 362/800
[58] Field of Search ...................... 257/88, 91, 99, 89, 257/90; 313/500; 346/107 R, 160, 160.1; 362/800

[56] References Cited

U.S. PATENT DOCUMENTS

| | | | |
|---|---|---|---|
| 4,605,944 | 8/1986 | Ishii et al. | 257/91 |
| 4,707,716 | 11/1987 | Daniele | 257/91 |
| 4,721,977 | 1/1988 | Fukse | 346/107 R X |
| 4,951,098 | 8/1990 | Albergo et al. | 346/107 R X |
| 5,134,340 | 7/1992 | Haitz | 257/91 X |
| 5,138,337 | 8/1992 | Ng | 346/107 R |
| 5,138,338 | 8/1992 | Mochizuki et al. | 346/107 R |

*Primary Examiner*—William Mintel
*Attorney, Agent, or Firm*—Raymond L. Owens

[57] ABSTRACT

A light-emitting diode print head having a narrow LED array chip wherein the constituent LEDs of the array are arranged in a zigzag formation and driven using a differential timing arrangement that compensates for the offset of alternate LEDs in the printing line. The LED array comprises a plurality of light-emitting elements arrayed in a staggered configuration of odd and even numbered elements in parallel rows extending in a first, print line direction and a plurality of electrodes connected to the corresponding light-emitting elements and arranged in a mutually alternating orientation extending between the parallel rows at right-angles to the first direction and forming parallel rows of odd and even numbered electrode terminals interleaved between the even and odd numbered light-emitting elements, respectively.

6 Claims, 5 Drawing Sheets

LIGHT-EMITTING DIODE PRINT HEAD WITH STAGGERED ELECTRODES

BACKGROUND OF THE INVENTION

1. Field of the Invention

The present invention relates to a light-emitting diode (LED) print head, and more particularly to an LED printer print head that uses an array of LEDs to produce the print images.

2. Description of the Prior Art

The increasing use of information processing devices such as word processors and the like has resulted in the emergence of various types of printers to output the information. For applications in which the emphasis is on quietness, high speed and high print quality, the most extensively used printers are electrophotographic printers. Laser printers and liquid-crystal printers are two examples of such printers, but in addition there is the LED printer, which uses a print head comprised of an array of LEDs. In the LED printer, printing comprises using image signals to drive the print head LED array and form an electrostatic latent image on a photosensitive drum, and the image is then developed and transferred to paper.

FIG. 1 is a plan view of a first example of a conventional LED print head that uses an LED array chip 11. In this arrangement, a number of LEDs are arrayed at a constant pitch P1 longitudinally (the direction indicated by an arrow 12) along an LED array chip 11, and emit light in accordance with image signals supplied via the respective electrodes. The electrodes are arranged along each side across the width of the chip 11 (the direction indicated by arrow 17) so that the electrodes 15 of odd-numbered LEDs 13 are at one side and the electrodes 16 of even-numbered LEDs 14 are at the other in a staggered formation. As a result, at each side, the electrode pitch P2 is twice the LED pitch P1.

FIG. 2 is a longitudinal cross-sectional view showing the LED print head in which the LED array chip 11 of FIG. 1 is used, and peripheral portions. Thus, in this arrangement the LED print head 21 is provided with the LED array chip 11 which is driven by a first external drive circuit 22 and a second external drive circuit 23. With reference to the drawing, the LED array chip 11 is shown with its longitudinal axis thereof perpendicular to the surface plane of the drawing sheet and its emission plane facing a self-focussing rod-lens array 29. Image signals 28 from an image signal supply circuit (not shown) are divided into odd-numbered and even-numbered image signals 26 and 27 for input to the respective drive circuits.

Wires 24 connect the first external drive circuit 22 to the electrodes 15 of the odd-numbered LEDs 13 (FIG. 1), whereby the LEDs 13 are driven in accordance with the image signals 26. Similarly, wires 25 connect the second external drive circuit 23 to the electrodes 16 of the even-numbered LEDs 14, whereby the LEDs 14 are driven in accordance with the image signals 27.

The image signals 28 that are input to the LED print head 21 thus configured are divided into odd-numbered image signals 26 and even-numbered image signals 27 for input to the first and second external drive circuits 22 and 23. These first and second external drive circuits 22 and 23 apply a current to electrodes 15 and 16 that corresponds to the input image signals 26 and 27. The current applied to the electrodes gives rise to light emission by the LEDs 13 and 14 and flows to ground via a common electrode (not shown) provided on the lower surface of the LED array chip 11.

The one-dimensional pattern of light emission thus produced by the LED array chip 11 is then focussed by the self-focussing rod-lens array 29 to form a print line image on a photosensitive drum 31. The self-focussing rod-lens array 29 is comprised of self-focussing rod-lenses for each of the component LEDs on the chip 11, the said rod-lenses being arrayed perpendicularly, with respect to the surface plane of the drawing sheet. An electrostatic latent image that corresponds to the pattern of light emission focussed by the self-focussing rod-lens array 29 is formed on the photosensitive drum 31, that rotates at a constant speed in the direction indicated by the arrow 32. The latent image is developed by a processing section (not shown) and then transferred to paper.

The width L of the LED array chip with odd-numbered and even-numbered electrodes thus arranged in a staggered configuration along the face of the chip, will therefore be:

$$L = 2L1 + L2 \tag{1}$$

FIG. 3 is a plan view of a second example of a conventional LED print head that uses an LED array chip. With reference to the drawing, a number of LEDs 36 are arrayed at a constant pitch P1 longitudinally (the direction indicated by arrow 12) along an LED array chip 35, and emit light in accordance with image signals supplied via respective electrodes 37. These electrodes 37 are arranged along only one side of the chip, in the direction in which the LEDs are arrayed and, also, at a pitch P1. In this case the width L' of the LED array chip 35 will be:

$$L' = L1 + L2 \tag{2}$$

Printers with multilevel printing capability can employ area-based gradation or multiple density levels. In the majority of printers that employ an LED print head, area-based gradation is used in association with dithering. In such cases, the print head pixel density has to be several times higher than the printer resolution. For example, in the case of a printer that has a resolution of 600 dpi (dots per inch), the pixel density of the print head would have to be at least 1200 dpi. To realize this, the spacing pitch P1 of the print head LEDs has to be in the order of 21 micrometers. This means that the electrode pitch P2 in the case of the conventional art example shown in FIG. 1 would be 42 micrometers, and 21 micrometers in the case of the second conventional example of FIG. 3.

However, with the present state of wire bonding technology, to ensure that adjacent wires do not touch, a minimum spacing of about 40 micrometers between bonds is used. This means that present wire bonding techniques can be applied to the first conventional example but not to the second conventional example.

An electrode needs to be about 90 micrometers long, as the length of the diode contact section is about 10 micrometers, plus about 20 micrometers for the lead-in portion and 60 micrometers for the wire bonding portion. Based on equation (2), this means a chip width of 110 micrometers in the case of the second conventional example of FIG. 3, but in the case of the first conventional example the width would have to exceed 200 micrometers, giving the latter chip about twice the area of the former chip.

In the semiconductor device fabrication process where large numbers of devices are fabricated on a wafer of semiconductor material, the smaller the area per device, the better the fabrication efficiency and the lower the cost. As in the case of an LED array the length of the array is determined by the number and density of the pixels, any cost reductions to be derived from reductions in the size of the chip have to come from a decrease in the width of the chip. Hence, improving fabrication efficiency and reducing costs are difficult to achieve in the case of devices with a large chip width, such as that of the first conventional example of FIG. 1. Thus, reducing the area of conventional print head LED array chips has presented a major problem, given the limitations of current wire bonding technology.

SUMMARY OF THE INVENTION

The object of the present invention is therefore to provide a light-emitting diode print head that uses a narrow LED array chip that can be readily fabricated using present-day technology.

In accordance with the present invention, this object is attained by an improved light-emitting diode print head comprising an LED array comprising a plurality of light-emitting elements arrayed in a staggered configuration of odd and even numbered elements in parallel rows extending in a first direction and a like plurality of electrodes connected to the corresponding light-emitting elements and arranged in a mutually alternating orientation inwardly therefrom at right-angles to the first direction. Preferably, the rows of odd and even numbered electrode terminals are formed in the respective rows and between the even and odd numbered light-emitting elements, respectively. In order to print an image line in registration and to overcome the offset distance between the rows of odd and even numbered light-emitting elements, print line signal data is separated into respective sets of odd and even numbered image signal data by time differential generation means that applies a prescribed time differential between the odd numbered image signals input via odd-numbered electrodes and the even numbered image signals input via even-numbered electrodes through LED driver circuit means that in accordance with the image signals drives the constituent even and odd numbered light-emitting elements of the LED array.

With this arrangement in which the light-emitting portions and electrodes are arrayed in a staggered formation, the width of the chip can be substantially the same as the combined length of one light-emitting portion plus its corresponding electrode, and the staggered emission pattern can be corrected to a linear pattern by applying a suitable prescribed time differential to the activation of odd-numbered and even-numbered light-emitting portions.

Further features of the invention, its nature and various advantages will become more apparent from the accompanying drawings and following detailed description of the invention.

DESCRIPTION OF THE PREFERRED EMBODIMENTS

Figure 4:
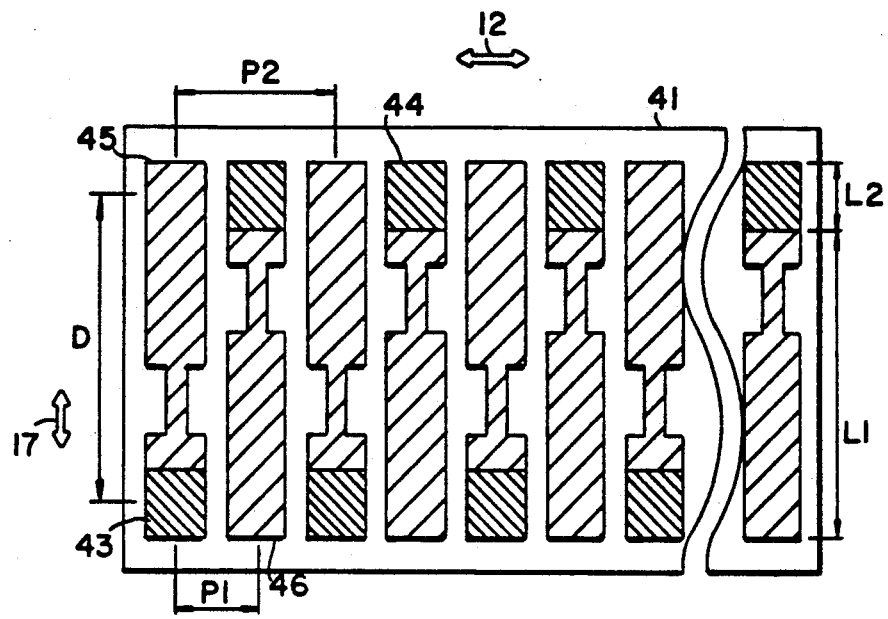
FIG. 4 shows a plan view of a LED array chip used in an LED print head according to the first embodiment of the present invention.

FIG. 4 shows a LED array chip used in an LED print head according to a first embodiment of the present invention. In this arrangement, a number of LEDs are arrayed in a staggered formation, at a constant pitch P1, longitudinally (the direction indicated by arrow 12) along an LED array chip 41. P1 is the pitch of the odd-numbered LEDs 43 and even-numbered LEDs 44 longitudinally along the chip, and D is the distance between LEDs widthwise across the chip. The odd-numbered LEDs 43 and even-numbered LEDs 44 are connected to electrodes 45 and 46, respectively, arranged across the width of the chip in a mutually opposed orientation. The requisite width of the chip is thus obtained from equation (2).

Figure 1:
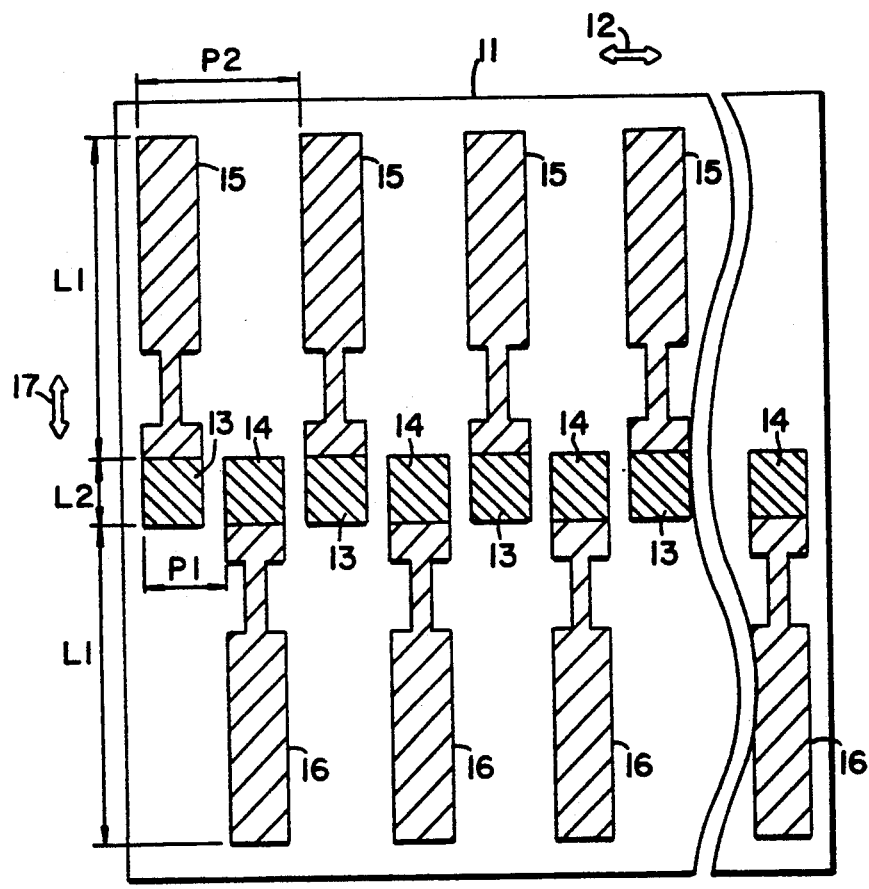
FIG. 1 is a plan view of a first example of a conventional print head that uses an LED array chip.
Figure 5:
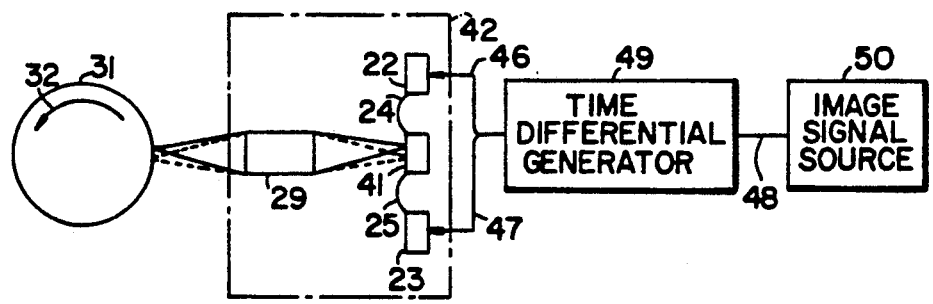
FIG. 5 is a schematic diagram of the LED print head according to the first embodiment, together with the surrounding portions thereof.

FIG. 5 shows an LED print head 42 that uses the LED array chip 41 of FIG. 4, together with the surrounding portions thereof. Parts that are the same as parts described with reference to the conventional arrangement of FIG. 1 have been given the same reference numerals, and the further description of such parts is omitted unless specifically pertinent. The LED print head 42 is provided with first and second external drive circuits 22 and 23 for driving the LED array chip 41. The LED array chip 41 is shown with its longitudinal axis thereof perpendicular to the surface plane of the drawing sheet and its emission plane facing a self-focussing rod-lens array 29.

Image signals 48 output by an image signal supply circuit (not shown) are divided into two sets of image signals 46 and 47 that have a prescribed time differential and are input to the first and second external drive circuits 22 and 23. Wires 24 connect the first external drive circuit 22 to the electrodes 45 of the odd-numbered LEDs 43 (FIG. 4), whereby the LEDs 43 are driven in accordance with the image signals 46. Similarly, wires 25 connect the second external drive circuit 23 to the electrodes 46 of the even-numbered LEDs 44, whereby the LEDs 44 are driven in accordance with the image signals 47.

Figure 6:
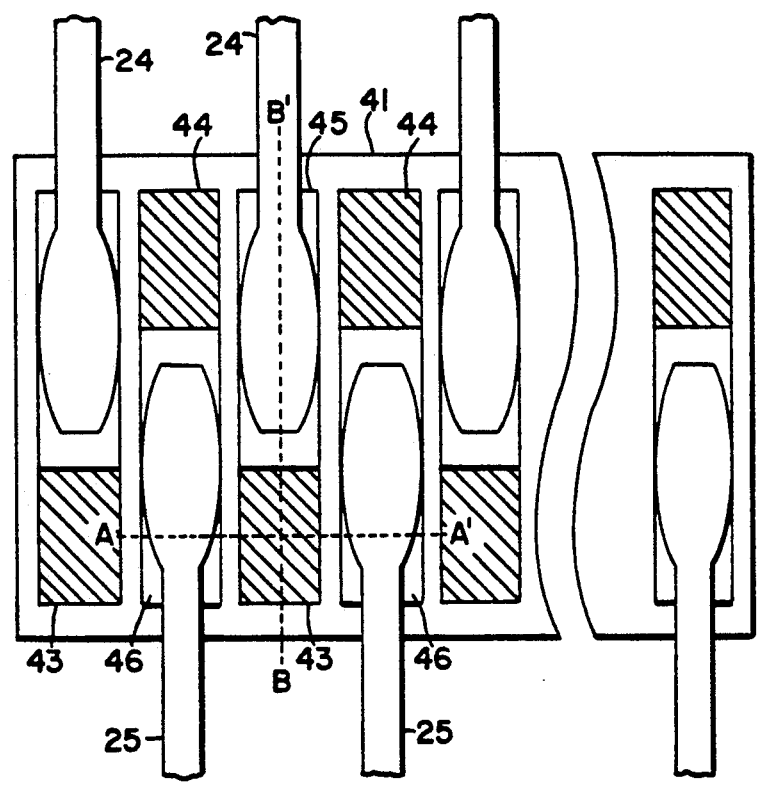
FIG. 6 is a plan view of part of a wire bonding arrangement used for external connection of an LED array chip.
Figure 7:
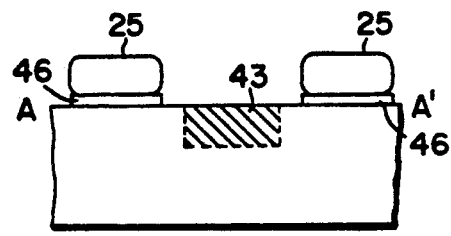
FIG. 7 is a cross-sectional view along the dotted line A—A' shown in FIG. 6.
Figure 8:
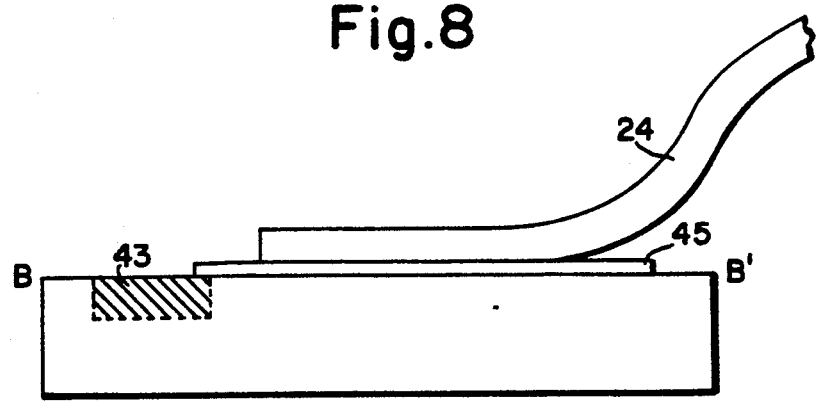
FIG. 8 is a cross-sectional view along the dotted line B—B' shown in FIG. 6.

FIGS. 6 to 8 illustrate an example of the wire-bonding external connection arrangement of the chip, with FIG. 6 being a plan view of the LED array chip 41, FIG. 7 a cross-sectional view through line A—A' of FIG. 6 and FIG. 8 a cross-sectional view through line B—B' of FIG. 6.

The wires 24 connect the odd-numbered electrodes 45 to the first external drive circuit 22 and wires 25 connect the even-numbered electrodes 44 to the second external drive circuit 23. Here, the pitch P2 of the wires on each side is twice the pitch P1 of the electrodes.

Figure 2:
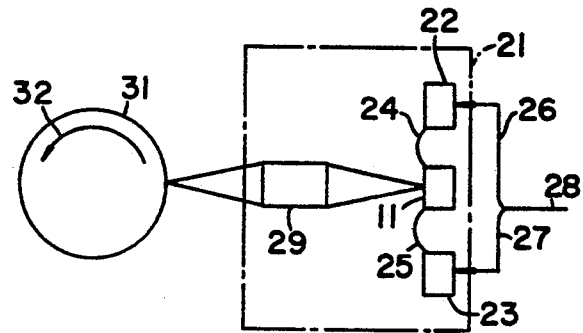
FIG. 2 is a schematic diagram of a conventional LED print head together with the surrounding portions.
Figure 3:
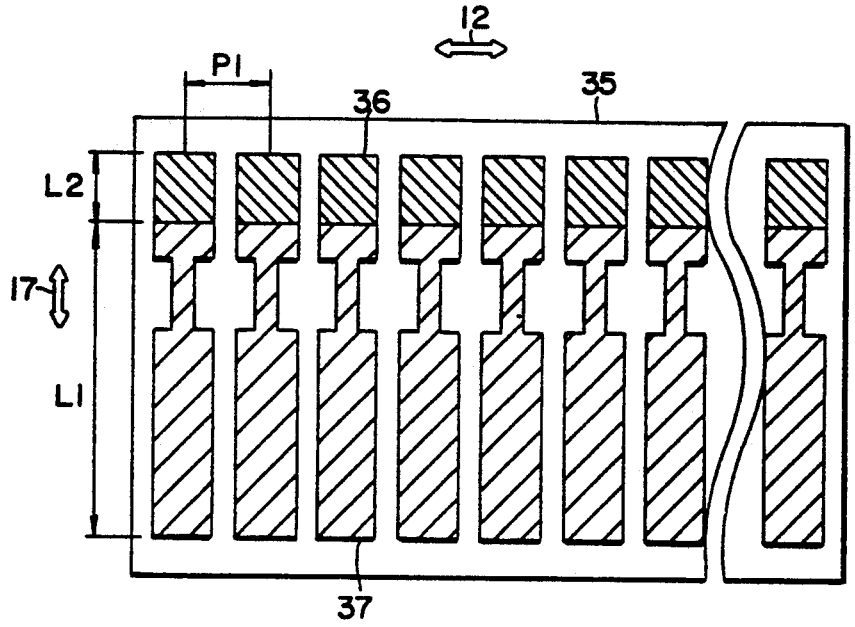
FIG. 3 is a plan view of a second example of a convention LED print head that uses a LED array chip.

Thus, if the electrodes were arranged at a pitch of 21 micrometers, P2 would be 42 micrometers, which is well within the capabilities of current wire bonding technology. Based on equation (2), the width of the chip will be around 110 micrometers, the same as the width of the second conventional example (FIG. 3), thereby providing a smaller chip area. In other respects, the structure is the same as that of the conventional example shown in FIG. 2.

The operation of the light-emitting diode print head thus configured will now be described. Image signals 48 output from an image signal source circuit 50 are input to a time differential generator 49 that divides the signals into image signals 46 corresponding to odd-numbered pixels and image signals 47 corresponding to even-numbered pixels. These two sets of image signals 46 and 47 are input, with a prescribed time differential, to the first and second external drive circuits 22 and 23.

If S is the peripheral speed of the photosensitive drum 31, then time differential T will be:

$$T = D/S \qquad (3)$$

where and D is the widthwise distance between the odd-numbered LEDs 43 and the even-numbered LEDs 44.

These first and second external drive circuits 22 and 23 apply a current to the odd-numbered electrodes 45 and even-numbered electrodes 46 that corresponds to the input image signals 46 and 47. This current produces light emission by the LEDs 43 and 44 and flows to ground via a common electrode (not shown) provided on the lower surface of the LED array chip 41. The time differential T between image signals 46 and 47 means that the emission of light by the odd-numbered LEDs 43 will be separated by time T from the emission of light by the even-numbered LEDs 44.

The one-dimensional pattern of light emission thus produced by the odd-numbered LEDs 43 (hereinafter also referred to as "odd-numbered emission pattern") and the one-dimensional pattern of light emission produced by the even-numbered LEDs 44 (hereinafter also referred to as "even-numbered emission pattern") are then focussed by the self-focussing rod-lens array 29 to form an image on a photosensitive drum 31. The image formation is performed with a time differential T between the odd-numbered and even-numbered emission patterns that corresponds to the peripheral speed S of the photosensitive drum 31, so that the emissions that create the electrostatic latent image on the surface of the drum are produced linearly. Thus, differential timing of the LED emissions is thereby used to compensate for the staggered arrangement of the diodes on the LED array chip 41. The electrostatic latent image thus formed on the photosensitive drum 31 is developed by a processing section (not shown) and then transferred to paper.

While the above description of the present invention related to an electrophotographic system that uses a photosensitive drum, the invention is not limited thereto. Instead, the invention can be applied with the same effect to other systems, for example to a silver halide photographic system that uses a photosensitive silver halide agent. Similarly, the invention is not limited to the use of a self-focussing rod-lens array, and may instead use another optical system, or dispense with any optical system and instead use a direct image formation arrangement. Also, while the foregoing description uses the example of wire bonding to connect the electrodes with the drive circuits, it is to be understood that other wiring methods may be applied without departing from the scope of the invention, such as tape-automated bonding (TAB) systems that uses a film carrier.

What is claimed is:

1. A light-emitting diode print head comprising:
    an LED array comprising a plurality of light-emitting elements arrayed in a staggered configuration of odd and even numbered elements in respective first and second parallel rows extending in a first direction;
    a like plurality of electrodes connected to the corresponding light-emitting elements and arranged in a mutually alternating orientation, each electrode extending from each connected odd and even numbered light emitting element in the respective first and second parallel rows and forming parallel rows of electrode terminals extending in the first direction and interspersed between adjacent even and odd numbered light-emitting elements in the respective second or first rows of light emitting elements.

2. The print head of claim 1 further comprising:
    first and second driver circuit means coupled to the rows of odd and even numbered electrode terminals, respectively, and responsive to interleaved odd and even numbered image signal data of the print line image signal data for energizing the respective even and odd numbered light emitting elements in accordance with the data;
    a source of print line image signal data including the interleaved odd and even numbered image signal data for each print line;
    time differential generation means for acting on the print line image signal data for separating it into the odd and even numbered image signal data for each print line and for applying the respective data to the first and second driver circuit means in a time differential related to a distance between the odd and even numbered light emitting element rows and an advancement of the print media to effect registration of the print line image on the media; and
    means for advancing the print media past the print head in a second direction.

3. In an LED printer of the type comprising a light emitting diode print head for exposing a photosensitive media to form images thereon in a line-by-line basis as the media is moved past the print head, the improvement in the print head comprising:
    an LED array comprising a plurality of light-emitting elements arrayed in a staggered configuration of odd and even numbered elements in respective first and second parallel rows extending in a first direction;
    a like plurality of electrodes connected to the corresponding light-emitting elements and arranged in a mutually alternating orientation, each electrode extending from each connected odd and even numbered light emitting element in the respective first and second parallel rows and forming parallel rows of electrode terminals extending in the first direction and interspersed between adjacent even or odd numbered light-emitting elements in the respective second or first rows of light emitting elements.

4. The printer of claim 3 further comprising:

first and second driver circuit means coupled to the odd and even numbered rows of electrode terminals, respectively, and responsive to interleaved odd and even numbered image signal data of the print line image signal data for energizing the respective even and odd numbered light emitting elements in accordance with the data;

a source of print line image signal data including the interleaved odd and even numbered image signal data for each print line; and time differential generation means for acting on the print line image signal data for separating it into the odd and even numbered image signal data for each print line and for applying the respective data to the first and second driver circuit means in a time differential related to a distance between the odd and even numbered light emitting element rows and an advancement of the print media to effect registration of the print line image in a print line on the media; and means for advancing the print media past the print head at right angles to the print line direction.

5. The print head of claim 1 wherein each of the plurality of electrodes extends from a respective connected light emitting element in one of the parallel rows of light emitting elements to an electrode terminal in the other of the parallel rows of light emitting elements generally at right angels to the first direction.

6. The improved print head of claim 3 wherein each of the plurality of electrodes extends from a respective connected light emitting element in one of the parallel rows of light emitting elements to an electrode terminal in the other of the parallel rows of light emitting elements generally at right angles to the first direction.

* * * * *